US012733246B2

(12) United States Patent
Asaba et al.

(10) Patent No.: US 12,733,246 B2
(45) Date of Patent: Sep. 8, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Shunsuke Asaba, Himeji Hyogo (JP); Hiroshi Kono, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 381 days.

(21) Appl. No.: 18/463,237

(22) Filed: Sep. 7, 2023

(65) Prior Publication Data

US 2024/0313107 A1 Sep. 19, 2024

(30) Foreign Application Priority Data

Mar. 16, 2023 (JP) ................................ 2023-041976

(51) Int. Cl.
*H10D 84/00* (2025.01)
*H10D 62/10* (2025.01)
*H10D 62/832* (2025.01)

(52) U.S. Cl.
CPC ......... *H10D 84/146* (2025.01); *H10D 62/127* (2025.01); *H10D 62/8325* (2025.01)

(58) Field of Classification Search
CPC . H10D 62/127; H10D 62/8325; H10D 84/146
See application file for complete search history.

(56) References Cited

U.S. PATENT DOCUMENTS

| | | | |
|---|---|---|---|
| 9,786,778 | B1 | 10/2017 | Morizuka |
| 11,502,173 | B2 | 11/2022 | Shimizu |
| 11,527,615 | B2 | 12/2022 | Suto et al. |
| 11,527,661 | B2 | 12/2022 | Irifune et al. |

(Continued)

FOREIGN PATENT DOCUMENTS

| | | | |
|---|---|---|---|
| JP | 2011-060930 | A | 3/2011 |
| JP | 6649183 | B2 | 2/2020 |

(Continued)

OTHER PUBLICATIONS

Notice of Reasons for Refusal mailed Feb. 16, 2026 in corresponding Japanese Patent Application No. 2023-041976, 10 pages (with Translation).

*Primary Examiner* — Fazli Erdem
(74) *Attorney, Agent, or Firm* — Kim & Stewart LLP

(57) ABSTRACT

A semiconductor device includes a first electrode, a first semiconductor layer connected to the first electrode and being of a first conductivity type, second semiconductor layers located on a portion of the first semiconductor layer and being of a second conductivity type, a third semiconductor layer located on a portion of the second semiconductor layer and being of the first conductivity type, a fourth semiconductor layer located in a portion of the first semiconductor layer between the second semiconductor layers and being of the second conductivity type, a second electrode facing the second semiconductor layer via an insulating film, and a third electrode connected to the second and third semiconductor layers. The first, second, third, and fourth semiconductor layers include silicon and carbon.

11 Claims, 8 Drawing Sheets

(56) References Cited

U.S. PATENT DOCUMENTS

| | | | | |
|---|---|---|---|---|
| 2004/0099905 | A1* | 5/2004 | Baliga | H10D 64/117 257/E29.066 |
| 2010/0096692 | A1* | 4/2010 | Saito | H10D 62/111 257/330 |
| 2010/0155836 | A1* | 6/2010 | Hebert | H10D 30/65 257/334 |
| 2011/0057202 | A1 | 3/2011 | Kono | |
| 2014/0367771 | A1 | 12/2014 | Chatty | |
| 2017/0077272 | A1* | 3/2017 | Kubo | H02M 7/003 |
| 2017/0271324 | A1* | 9/2017 | Kumagai | H01L 21/761 |
| 2022/0013663 | A1 | 1/2022 | Kawahara et al. | |
| 2022/0271155 | A1 | 8/2022 | Kono | |
| 2023/0022394 | A1 | 1/2023 | Sdrulla | |
| 2023/0036221 | A1 | 2/2023 | Hino et al. | |

FOREIGN PATENT DOCUMENTS

| | | | |
|---|---|---|---|
| JP | 2021-002652 | A | 1/2021 |
| JP | 2021-077774 | A | 5/2021 |
| JP | 2022-030298 | A | 2/2022 |
| JP | 2022-051424 | A | 3/2022 |
| JP | 2022-130063 | A | 9/2022 |
| WO | 2020/110285 | A1 | 6/2020 |
| WO | 2021/161436 | A1 | 8/2021 |
| WO | 2023/009325 | A1 | 2/2023 |

* cited by examiner

SEMICONDUCTOR DEVICE

CROSS-REFERENCE TO RELATED APPLICATIONS

This application is based upon and claims the benefit of priority from Japanese Patent Application No. 2023-041976, filed on Mar. 16, 2023; the entire contents of which are incorporated herein by reference.

FIELD

Embodiments relate to a semiconductor device.

BACKGROUND

To safely carry return current in a semiconductor device for power control, an SBD (Schottky Barrier Diode) may be embedded in a MOSFET (Metal-Oxide-Semiconductor Field-Effect Transistor). It is desirable to reduce the gate-drain capacitance in such a semiconductor device to increase the operation speed.

DETAILED DESCRIPTION

A semiconductor device according to an embodiment, includes a first electrode, a first semiconductor layer, a plurality of second semiconductor layers, a third semiconductor layer, a fourth semiconductor layer, a second electrode, and a third electrode. The first semiconductor layer is connected to the first electrode. The first semiconductor layer includes silicon and carbon. The first semiconductor layer is of a first conductivity type. The plurality of second semiconductor layers are located on a portion of the first semiconductor layer. The plurality of second semiconductor layers include silicon and carbon. The plurality of second semiconductor layers are of a second conductivity type. The third semiconductor layer is located on a portion of the second semiconductor layer. The third semiconductor layer includes silicon and carbon. The third semiconductor layer is of the first conductivity type. The fourth semiconductor layer is located in a portion of the first semiconductor layer between the second semiconductor layers. The fourth semiconductor layer includes silicon and carbon. The fourth semiconductor layer is of the second conductivity type. The second electrode faces the second semiconductor layer via an insulating film. The third electrode is connected to the second and third semiconductor layers.

First Embodiment

Figure 1:
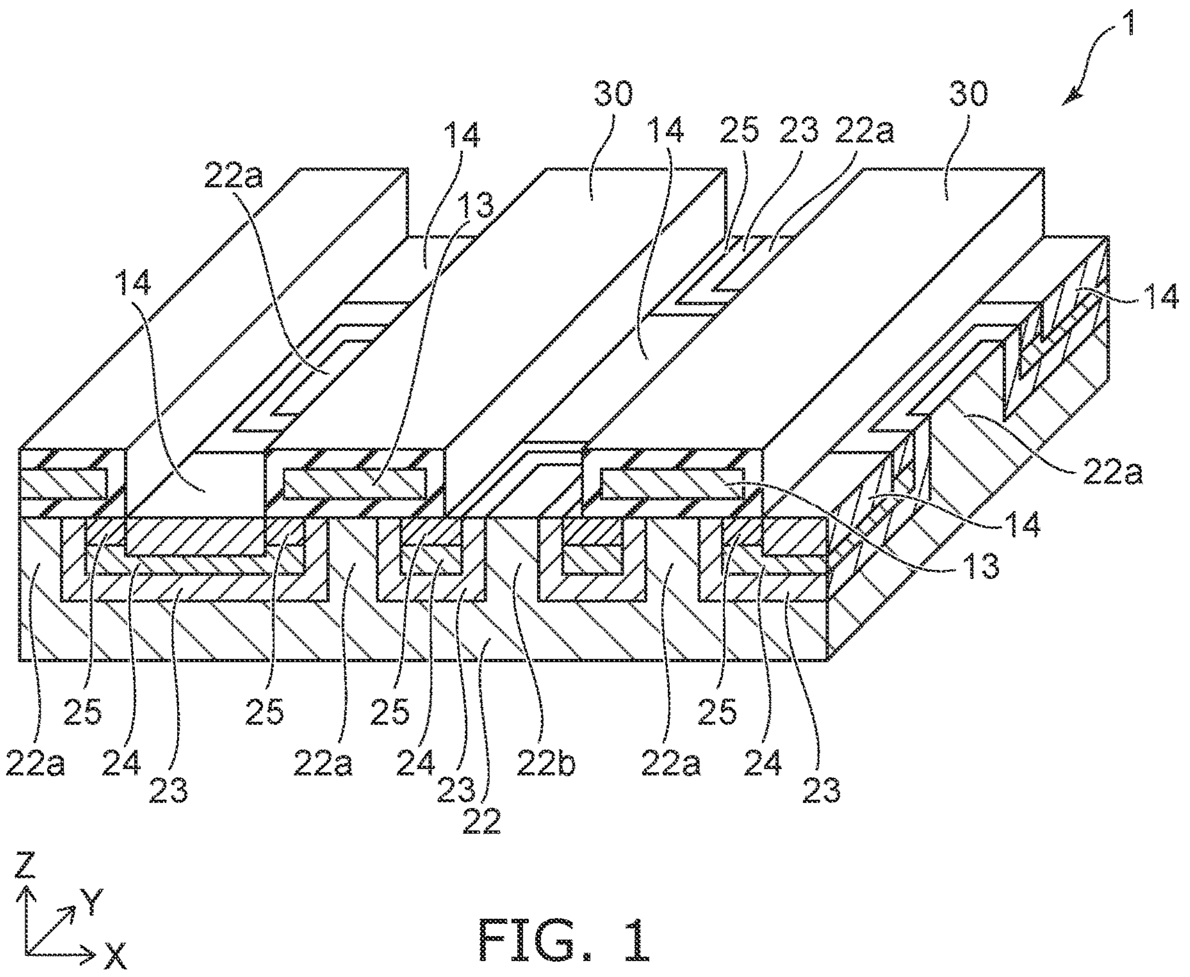
FIG. 1 is a perspective view showing a semiconductor device according to a first embodiment.

FIG. 1 is a perspective view showing a semiconductor device according to the embodiment.

Figure 2:
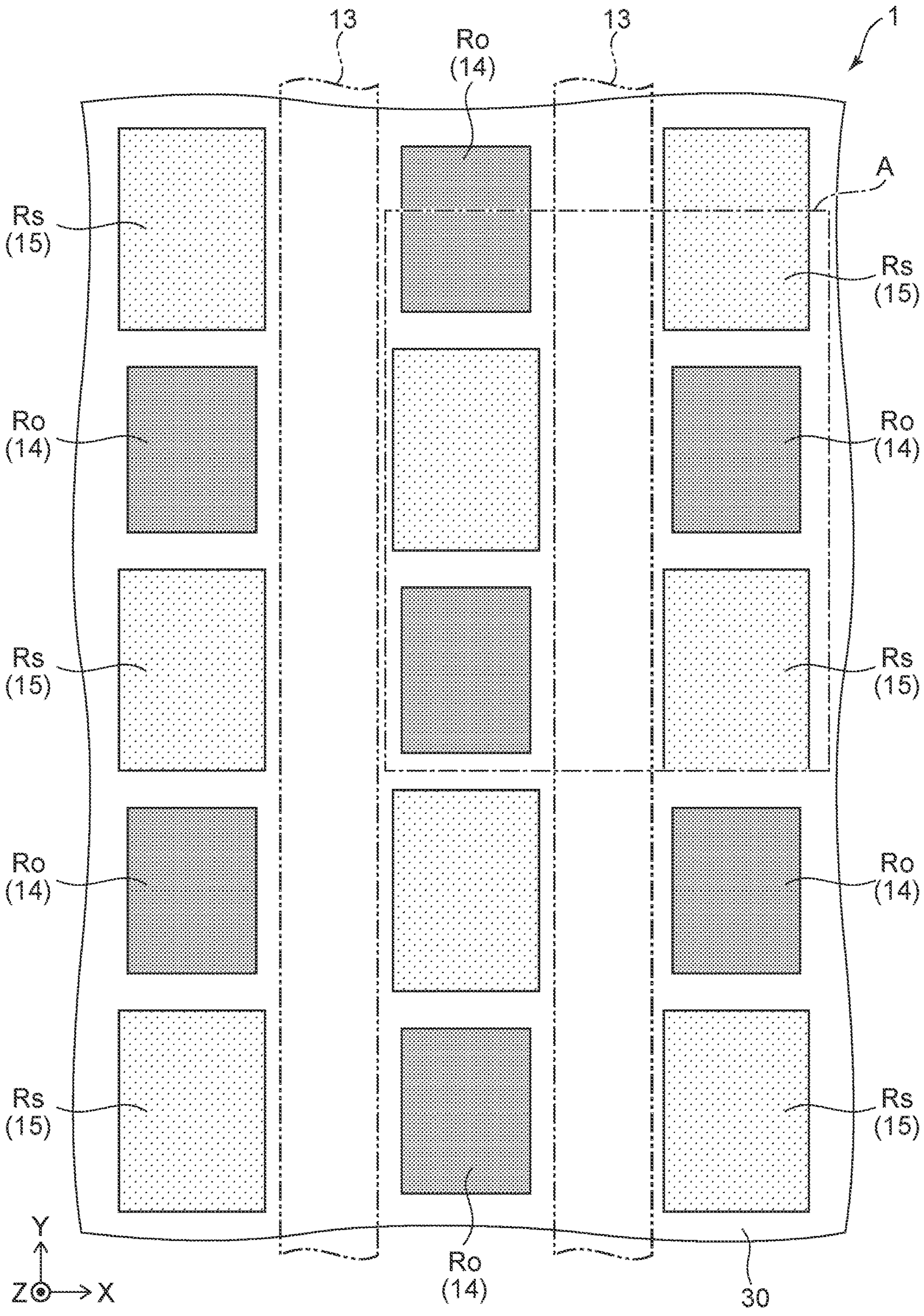
FIG. 2 is a top view showing the semiconductor device according to the first embodiment.

FIG. 2 is a top view showing the semiconductor device according to the embodiment.

Figure 3:
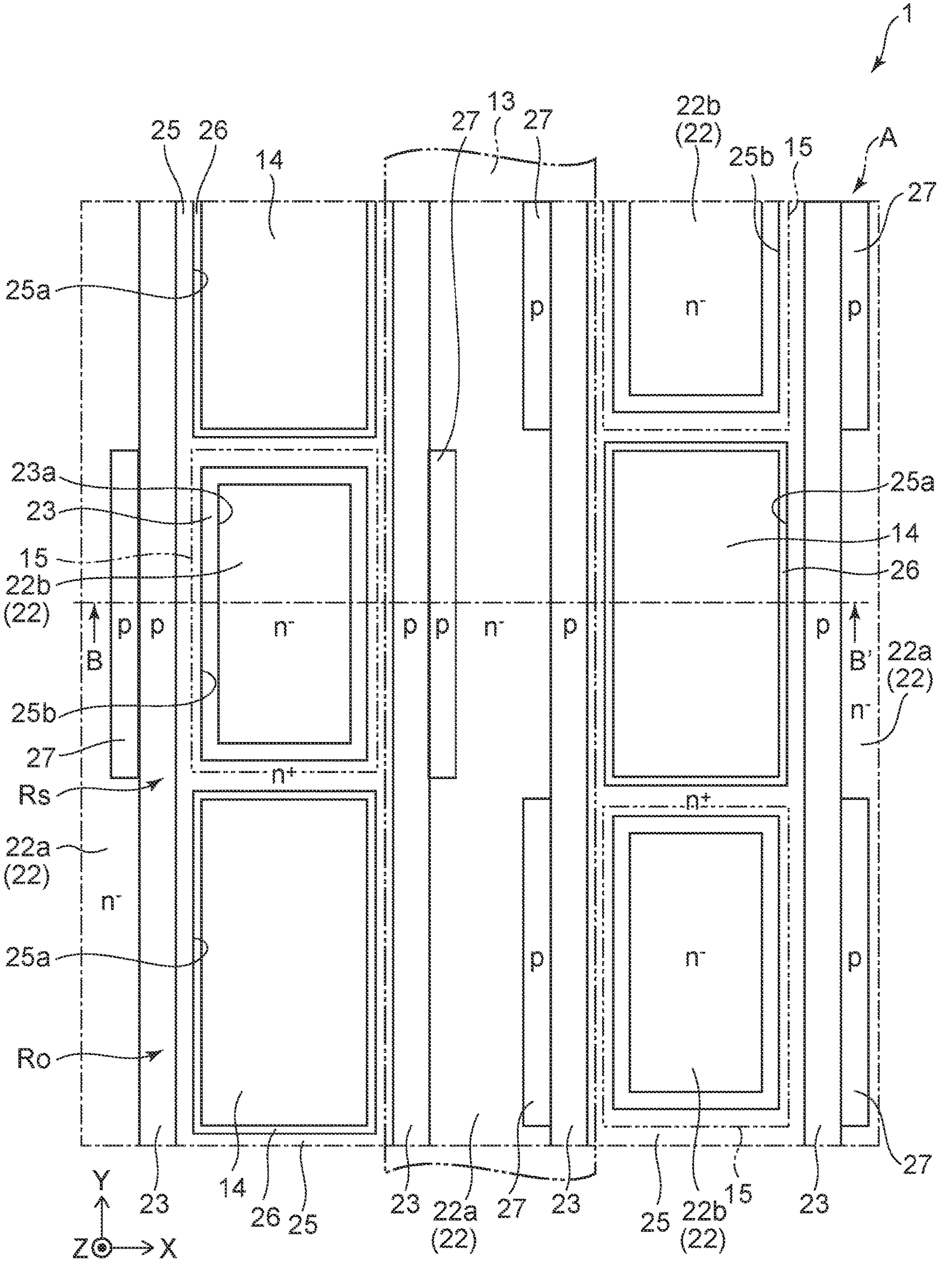
FIG. 3 is a top view showing region A of FIG. 2.

FIG. 3 is a top view showing region A of FIG. 2.

Figure 4:
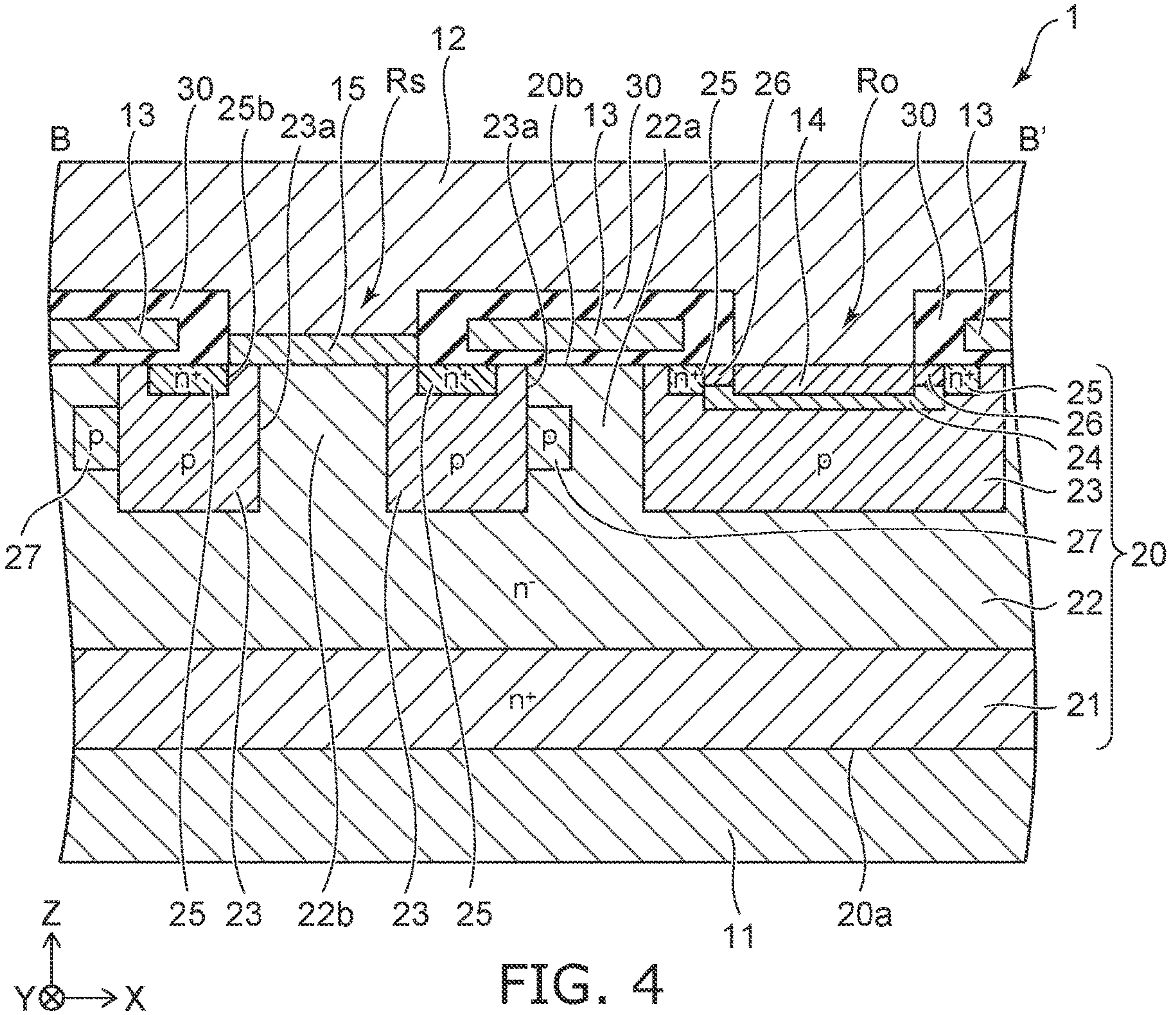
FIG. 4 is a cross-sectional view along line B-B' shown in FIG. 3.

FIG. 4 is a cross-sectional view along line B-B' shown in FIG. 3.

A drain electrode 11, a drain layer 21, a source electrode 12, a Schottky metal layer 15, a source contact layer 26, and a p-type layer 27 are described below, and are not illustrated in FIG. 1. Only a semiconductor part 20, a gate electrode 13, an ohmic conductive layer 14, and the Schottky metal layer 15 are shown in FIG. 2. In FIG. 3, the source electrode 12 and an insulating film 30 are not illustrated, and the gate electrode 13 and the Schottky metal layer 15 are illustrated by double dot-dash lines.

As shown in FIGS. 1 to 4, the semiconductor device 1 according to the embodiment includes the drain electrode 11 (a first electrode), the source electrode 12 (a third electrode), the gate electrode 13 (a second electrode), the ohmic conductive layer 14 (a conductive layer), the Schottky metal layer 15 (a metal layer), the semiconductor part 20, and the insulating film 30.

For example, the semiconductor part 20 has a rectangular plate shape. The drain electrode 11 is located on the entire surface of a lower surface 20*a* of the semiconductor part 20. The source electrode 12 is located on substantially the entire surface of an upper surface 20*b* of the semiconductor part 20. The semiconductor part 20 is made of a semiconductor material including silicon (Si) and carbon (C), and is made of, for example, single-crystal silicon carbide (SiC). The conductivity types of the parts of the semiconductor part 20 are set to a p-type or an n-type by introducing impurities. The semiconductor part 20 includes the drain layer 21, a drift layer 22, a base layer 23, a base contact layer 24, a source layer 25, the source contact layer 26, and the p-type layer 27 (a fourth semiconductor layer).

The conductivity type of the drain layer 21 is the n+-type; and the drain layer 21 is connected to the drain electrode 11. In the specification, "connected" means an electrical connection. The drain layer 21 forms the lower surface 20*a* of the semiconductor part 20. The conductivity type of the drift layer 22 is the n−-type. In other words, the carrier concentration of the drift layer 22 is less than the carrier concentration of the drain layer 21. The drift layer 22 is located on the drain layer 21 and contacts the drain layer 21. A first semiconductor layer includes the drain layer 21 and the drift layer 22.

Multiple base layers 23 are provided, and are located on a portion of the drift layer 22. The conductivity types of the base layers 23 are the p-type. Each base layer 23 has a band shape extending in one direction.

An XYZ orthogonal coordinate system is employed for convenience of description in the specification. The direction from the drain electrode 11 toward the source electrode 12 is taken as a "Z-direction"; the direction in which the base layers 23 extend is taken as a "Y-direction"; and a direction orthogonal to the Z-direction and the Y-direction is taken as an "X-direction". The Z-direction also is called "up", and the opposite direction also is called "down", but these expressions are for convenience and are independent of the direction of gravity.

The multiple base layers 23 are arranged along the X-direction; and each base layer 23 extends in the Y-direction. A portion 22*a* of the drift layer 22 is interposed between adjacent base layers 23. Multiple openings 23*a* are formed in each base layer 23 and are arranged in one column along the Y-direction. A portion 22*b* of the drift layer 22 extends into the opening 23*a*. The portion 22*a* of the drift layer 22 located between adjacent base layers 23 and the portion 22*b* of the drift layer 22 extending into the opening 23*a* reach the upper surface 20*b* of the semiconductor part 20. The positions of the openings 23*a* in the Y-direction are mutually shifted between the base layers 23 adjacent to each other in the X-direction. Therefore, the openings 23*a* are arranged in a staggered configuration when viewed along the Z-direction.

In the semiconductor device 1 as shown in FIG. 2, multiple ohmic connection regions Ro and multiple Schottky barrier diode regions Rs are set to be arranged in a checkered pattern. In other words, the ohmic connection regions Ro and the Schottky barrier diode regions Rs are alternately arranged along the X-direction and the Y-direction. The ohmic connection region Ro and the Schottky barrier diode region Rs are marked with hatching for easier viewing of the drawing in FIG. 2.

The ohmic conductive layer 14 is located in the ohmic connection region Ro. The ohmic conductive layer 14 is located on the semiconductor part 20, contacts the upper surface 20*b* of the semiconductor part 20, and has an ohmic connection with the semiconductor part 20. The ohmic conductive layer 14 is made of a conductive material and is made of, for example, nickel silicide (NiSi).

The Schottky barrier diode region Rs corresponds to the opening 23*a* of the base layer 23. The Schottky metal layer 15 is located in the Schottky barrier diode region Rs. The Schottky metal layer 15 is located on the semiconductor part 20 and contacts the portion 22*b* of the drift layer 22, the portion of the base layer 23 located at the periphery of the portion 22*b* of the drift layer 22, and a portion of the source layer 25.

The Schottky metal layer 15 forms a Schottky barrier diode with the portion 22*b* of the drift layer 22. The Schottky metal layer 15 is formed of a material that forms a Schottky junction with the n−-type drift layer 22 that is made of silicon carbide, and is formed of, for example, titanium (Ti).

In the semiconductor part 20 as shown in FIGS. 3 and 4, the source layer 25 is located on a portion of the base layer 23 and contacts the base layer 23. The source layer 25 is separated from the drift layer 22; and the base layer 23 is interposed between the source layer 25 and the drift layer 22. The conductivity type of the source layer 25 is the n+-type. For example, one source layer 25 is located on one base layer 23.

The source layer 25 has a ladder-like configuration when viewed along the Z-direction; and multiple openings 25*a* and 25*b* are formed in the source layer 25. The opening 25*a* is located in the ohmic connection region Ro; and the opening 25*b* is located in the Schottky barrier diode region Rs. Accordingly, the opening 25*a* and the opening 25*b* are alternately arranged in one column along the Y-direction in each source layer 25. The opening 25*a* and the opening 25*b* are alternately arranged along the X-direction in the multiple source layers 25 located on the multiple base layers 23.

The ohmic conductive layer 14 is located inside the opening 25*a* of the source layer 25. The source contact layer 26 is located between the source layer 25 and the ohmic conductive layer 14. The conductivity type of the source contact layer 26 is the n++-type. In other words, the carrier concentration of the source contact layer 26 is greater than the carrier concentration of the source layer 25. The source contact layer 26 contacts the source layer 25 and the ohmic conductive layer 14. A third semiconductor layer includes the source layer 25 and the source contact layer 26.

The base contact layer 24 is located between the base layer 23 and the ohmic conductive layer 14. The conductivity type of the base contact layer 24 is the p++-type. In other words, the carrier concentration of the base contact layer 24 is greater than the carrier concentration of the base layer 23. The base contact layer 24 contacts the ohmic conductive layer 14, the base layer 23, and the source contact layer 26. The second semiconductor layer includes the base layer 23 and the base contact layer 24.

The Schottky metal layer 15 is located in the region directly above the opening 25*b* of the source layer 25. The opening 23*a* of the base layer 23 is located inside the opening 25*b* of the source layer 25 when viewed along the Z-direction. The Schottky metal layer 15 contacts the portion 22*b* of the drift layer 22 in the opening 23*a* of the base layer 23, contacts the base layer 23 in the opening 25*b* of the source layer 25, and contacts the source layer 25 at the periphery of the opening 25*b*.

The p-type layer 27 is located in the portion 22*a* of the drift layer 22 between the base layers 23 and contacts the portion 22*a*. The conductivity type of the p-type layer 27 is the p-type; and the carrier concentration of the p-type layer 27 is substantially equal to the carrier concentration of the base layer 23. The p-type layer 27 is separated from the upper surface 20*b* of the semiconductor part 20. The upper surface of the p-type layer 27 is positioned lower than the upper surface of the base layer 23, i.e., the interface between the base layer 23 and the insulating film 30; and the lower surface of the p-type layer 27 is positioned higher than the lower surface of the base layer 23, i.e., the interface between the base layer 23 and the drift layer 22.

According to the embodiment, the p-type layer 27 is located at the Schottky barrier diode region Rs side of the portion 22*a* and contacts the side surface of the portion of the base layer 23 corresponding to the Schottky barrier diode region Rs. Therefore, the portion 22*a* of the drift layer 22 is interposed between the p-type layer 27 and the ohmic conductive layer 14.

The gate electrode 13 is located on the semiconductor part 20 and extends in the Y-direction. In the X-direction, the gate electrode 13 is provided over the region directly above the portion 22*a* of the drift layer 22 between the base layers 23, the region directly above the portion of the base layer 23 between the drift layer 22 and the source layer 25, and the region directly above the portion of the source layer 25 positioned at the portion 22*a* side. The p-type layer 27 is located in the region directly under the gate electrode 13.

The source electrode 12 is located on substantially the entire surface of the semiconductor part 20 and covers the gate electrode 13. The source electrode 12 contacts the ohmic conductive layer 14 and the Schottky metal layer 15 and has ohmic connections with the ohmic conductive layer 14 and the Schottky metal layer 15.

The insulating film 30 is located between the gate electrode 13 and the semiconductor part 20 and between the gate electrode 13 and the source electrode 12. The gate electrode 13 is therefore insulated from the semiconductor part 20 and the source electrode 12 by the insulating film 30.

Operations of the semiconductor device according to the embodiment will now be described.

Figure 5A:
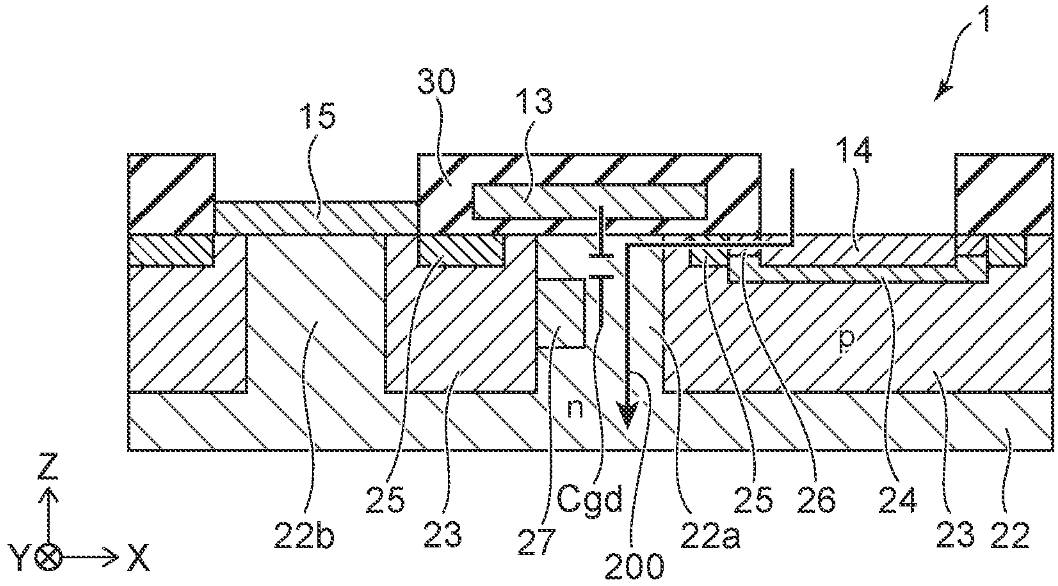
FIG. 5A is a cross-sectional view showing operations of the semiconductor device according to the first embodiment.
Figure 5B:
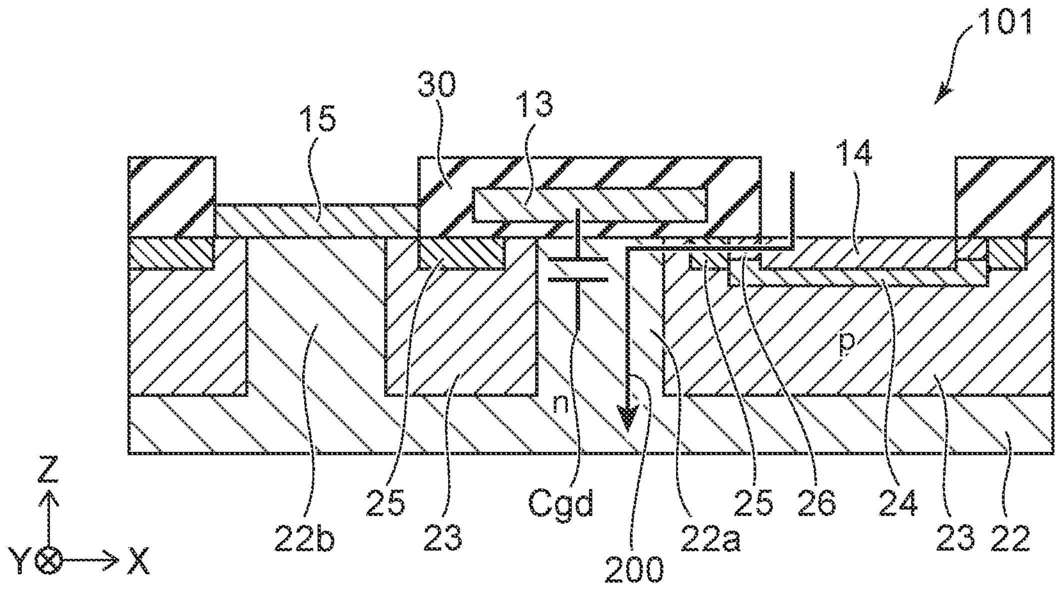
FIG. 5B is a cross-sectional view showing operations of a semiconductor device according to a comparative example.

FIG. 5A is a cross-sectional view showing operations of the semiconductor device according to the embodiment; and FIG. 5B is a cross-sectional view showing operations of a semiconductor device according to a comparative example.

In the semiconductor device 1 as shown in FIGS. 4 and 5A, when a voltage is applied between the drain electrode 11 and the source electrode 12 so that the drain electrode 11 is positive and the source electrode 12 is negative, a depletion layer (not illustrated) spreads with the interface between the drift layer 22 and the base layer 23 as a starting point. When a higher potential than a threshold is applied to the gate electrode 13 in this state, an inversion layer (not illustrated) is formed in the portion of the base layer 23 facing the gate electrode 13 via the insulating film 30; and an electron current 200 flows in the path of the source electrode 12, the ohmic conductive layer 14, the source contact layer 26, the source layer 25, the inversion layer of the base layer 23, the drift layer 22, the drain layer 21, and the drain electrode 11. Accordingly, a current flows from the drain electrode 11 to the source electrode 12. On the other hand, when a lower potential than the threshold is applied to the gate electrode 13, the inversion layer disappears, and the current is blocked.

There are cases where a return current caused by external inductance flows in the semiconductor device 1 from the source electrode 12 toward the drain electrode 11. In such a case, a hole current and an electron current flow in the path of the source electrode 12, the ohmic conductive layer 14, the base contact layer 24, the base layer 23, the drift layer 22, the drain layer 21, and the drain electrode 11 in the ohmic connection region Ro. Also, an electron current flows in the path of the drain electrode 11, the drain layer 21, the drift layer 22, the Schottky metal layer 15, and the source electrode 12. In the Schottky barrier diode region Rs, an electron current flows in the path of the drain electrode 11, the drain layer 21, the drift layer 22, the Schottky metal layer 15, and the source electrode 12.

Because the p-type layer 27 is provided in the portion **22*a* of the drift layer 22 in the semiconductor device 1, the facing area between the gate electrode 13 and the drift layer 22 is reduced, and a gate-drain capacitance Cgd is reduced. The portion of the drift layer 22 between the p-type layer 27 and the insulating film 30** is filled with the depletion layer.

When the semiconductor device 1 is in the on-state, the electron current 200 flows in both the ohmic connection region Ro and the Schottky barrier diode region Rs as described above. Because the p-type layer 27 is located at the Schottky barrier diode region Rs side of the portion **22*a*, there may be some effect on the electron current 200 flowing through the Schottky barrier diode region Rs; however, there is little effect on the electron current 200 flowing through the ohmic connection region Ro. Therefore, even when the p-type layer 27 is provided, the increase of the on-resistance Ron of the semiconductor device 1** can be suppressed. In a short-circuit, the current that flows is larger than that of the normal on-state; therefore, the vicinity of the current path generates more heat and has a higher temperature. Therefore, the resistance is increased, and the short-circuit current is suppressed.

In contrast, in the semiconductor device 101 according to the comparative example as shown in FIG. 5B, the p-type layer 27 is not included. Therefore, the facing area between the gate electrode 13 and the drift layer 22 is large, and the gate-drain capacitance Cgd is large.

Effects of the embodiment will now be described.

In the semiconductor device 1 according to the embodiment, the p-type layer 27 is located at the Schottky barrier diode region Rs side in the portion **22*a* of the drift layer 22; therefore, the increase of the on-resistance Ron can be suppressed while reducing the gate-drain capacitance Cgd. Therefore, the semiconductor device 1** has a good balance between the gate-drain capacitance Cgd and the on-resistance Ron.

Because the Schottky barrier diode region Rs is set and the Schottky metal layer 15 is located in the Schottky barrier diode region Rs in the semiconductor device 1, when the return current flows, an electron current flows in the Schottky barrier diode region Rs and causes a potential change, which suppresses the effective bias applied to the p-n junction, thereby suppressing a bipolar current flowing in the MOSFET and suppressing the enlargement of defects in the silicon carbide included in the semiconductor part 20 which increases the electrical resistance.

Because the ohmic connection region Ro and the Schottky barrier diode region Rs are arranged in a checkered pattern in the semiconductor device 1, the arrangement density of the gate electrodes 13 in the X-direction can be increased. The on-resistance of the semiconductor device 1 can be reduced thereby, and the on-current can be increased. In contrast, if the ohmic connection region Ro and the Schottky barrier diode region Rs are arranged in stripe shapes, the gate electrode 13 cannot be located in the Schottky barrier diode region Rs, and the maximum value of the on-current is therefore reduced.

Second Embodiment

Figure 6:
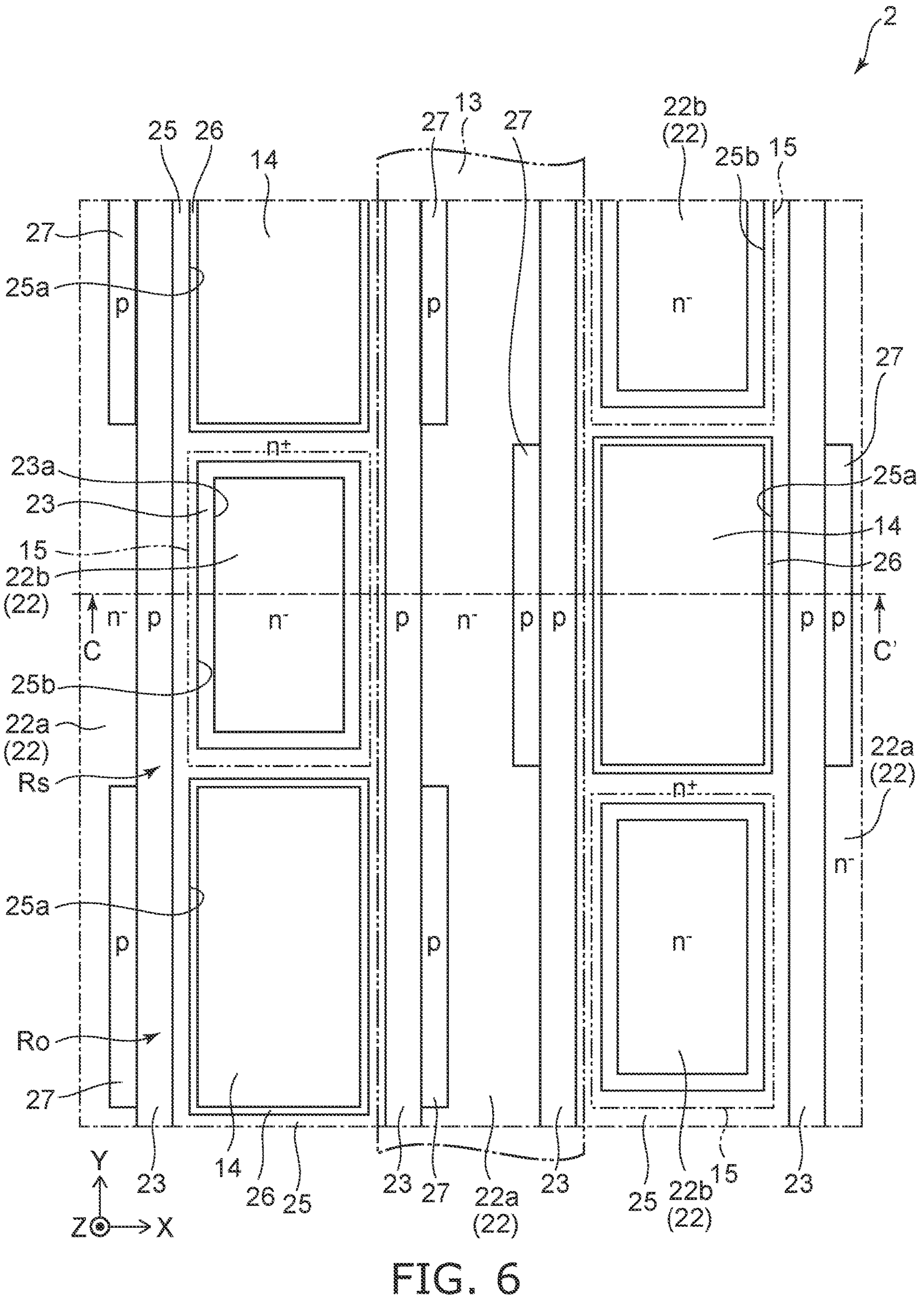
FIG. 6 is a top view showing a semiconductor device according to a second embodiment.

FIG. 6 is a top view showing a semiconductor device according to the embodiment.

Figure 7:
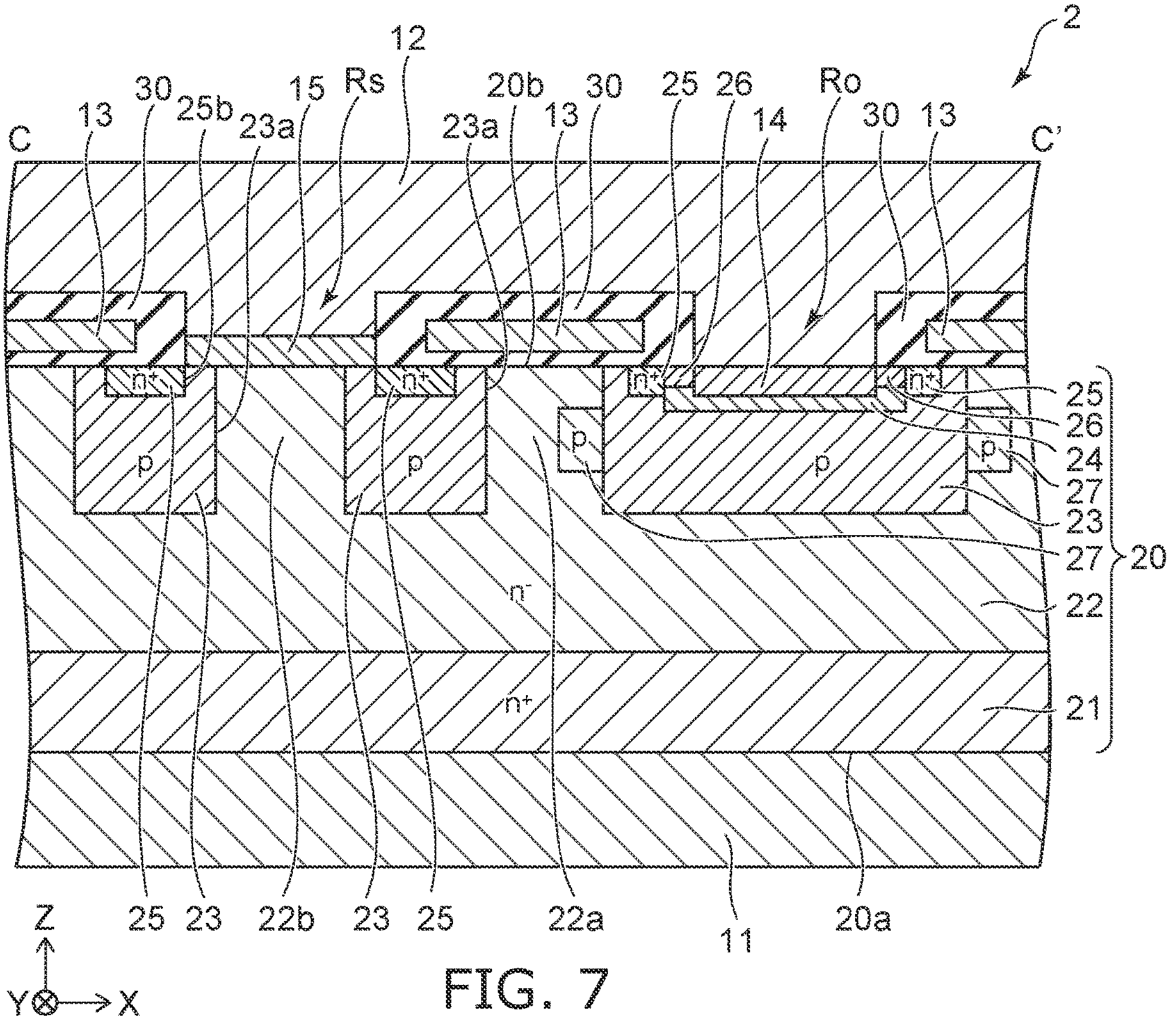
FIG. 7 is a cross-sectional view along line C-C' shown in FIG. 6.

FIG. 7 is a cross-sectional view along line C-C' shown in FIG. 6.

In FIG. 6, the source electrode 12 and the insulating film 30 are not illustrated, and the gate electrode 13 and the Schottky metal layer 15 are illustrated by double dot-dash lines. This is similar for FIG. 9 below.

As shown in FIGS. 6 and 7, the position of the p-type layer 27 in the semiconductor device 2 according to the embodiment is different from that of the semiconductor device 1 according to the first embodiment. In the semiconductor device 2, the p-type layer 27 is located at the ohmic connection region Ro side of the portion **22*a* of the drift layer 22. In other words, the p-type layer 27 contacts the side surface of the portion of the base layer 23 corresponding to the ohmic connection region Ro. Therefore, the portion 22*a* of the drift layer 22 is interposed between the p-type layer 27 and the Schottky metal layer 15**.

Operations and effects of the semiconductor device 2 according to the embodiment will now be described.

Figure 8:
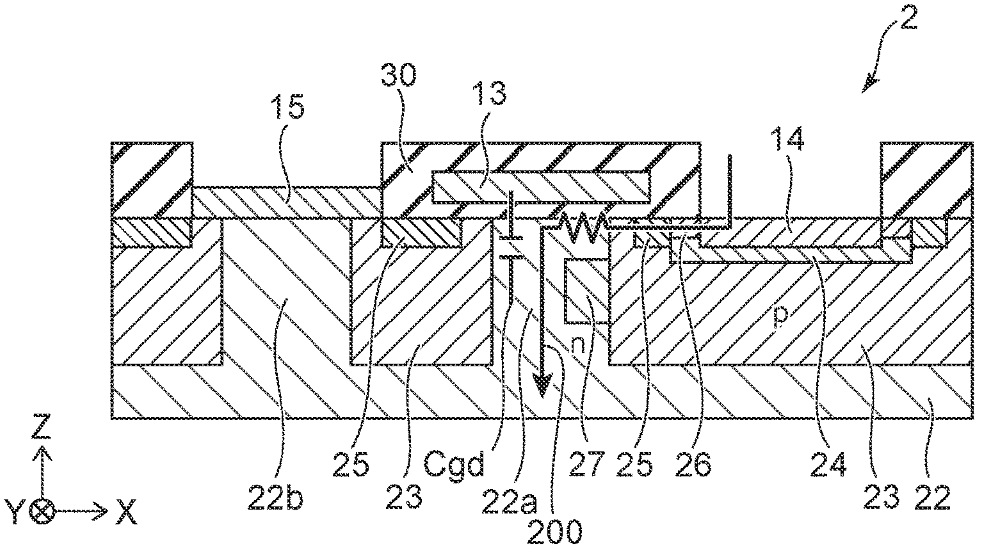
FIG. 8 is a cross-sectional view showing operations of the semiconductor device according to the second embodiment.

FIG. 8 is a cross-sectional view showing operations of the semiconductor device according to the embodiment.

According to the embodiment as shown in FIG. 8, similarly to the first embodiment, the p-type layer 27 is provided in the portion **22*a* of the drift layer 22; therefore, the facing area between the gate electrode 13 and the drift layer 22** is reduced, and the gate-drain capacitance Cgd is reduced.

Because the p-type layer 27 is located at the ohmic connection region Ro side, there may be some effect on the electron current 200 flowing through the ohmic connection region Ro; however, there is little effect on the electron current 200 flowing through the Schottky barrier diode region Rs. Thus, there is a trade-off relationship between the electron current 200 flowing through the ohmic connection region Ro and the electron current 200 flowing through the Schottky barrier diode region Rs that is dependent on the position of the p-type layer 27. Thus, according to the embodiment as well, the short-circuit withstand capacity of the semiconductor device 2 is improved. Otherwise, the configuration, operations, and effects according to the embodiment are similar to those of the first embodiment.

Third Embodiment

Figure 9:
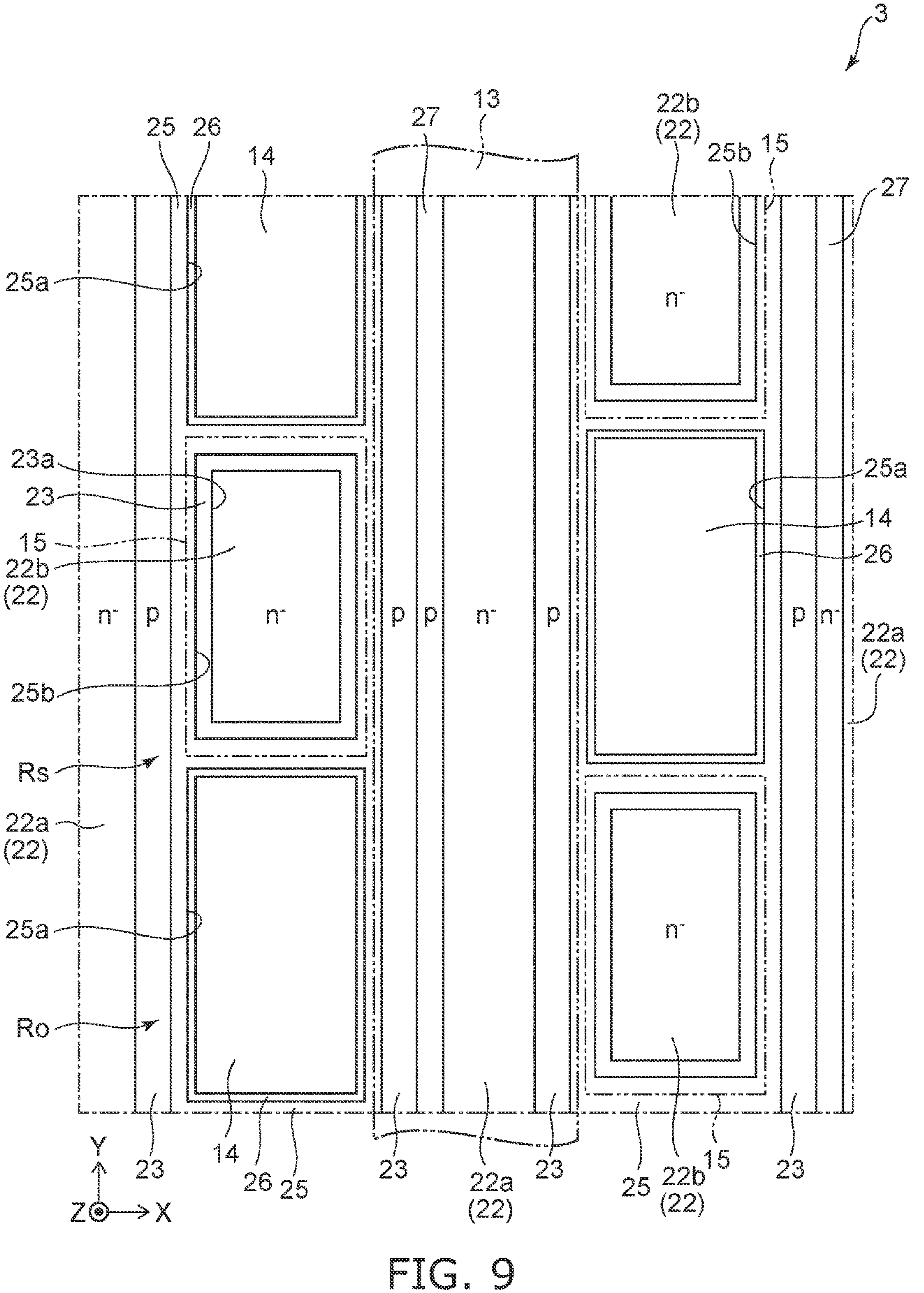
FIG. 9 is a top view showing a semiconductor device according to a third embodiment.

FIG. 9 is a top view showing a semiconductor device according to the embodiment.

In the semiconductor device 3 according to the embodiment as shown in FIG. 9, the p-type layer 27 is located at one X-direction side of the portion 22*a* of the drift layer 22. Therefore, the p-type layer 27 extends in the Y-direction along one side surface of the base layer 23.

According to the embodiment as well, the gate-drain capacitance Cgd can be reduced. Intermediate effects between those of the first and second embodiments are obtained for the on-resistance Ron and the short-circuit current flowing in a short-circuit. Otherwise, the configuration, operations, and effects according to the embodiment are similar to those of the first embodiment.

Although an example is shown in the embodiments described above in which the p-type layer 27 contacts the base layer 23, the p-type layer 27 may be separated from the base layer 23. Although an example is shown in the embodiments described above in which the p-type layer 27 is separated from the upper surface 20*b* of the semiconductor part 20, the p-type layer 27 may reach the upper surface 20*b* and may contact the insulating film 30.

According to the embodiments described above, a semiconductor device can be realized in which the gate-drain capacitance can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Embodiments include the following aspects.

Note 1

A semiconductor device, comprising:

a first electrode;

a first semiconductor layer connected to the first electrode, the first semiconductor layer including silicon and carbon, the first semiconductor layer being of a first conductivity type;

a plurality of second semiconductor layers located on a portion of the first semiconductor layer, the plurality of second semiconductor layers including silicon and carbon, the plurality of second semiconductor layers being of a second conductivity type;

a third semiconductor layer located on a portion of the second semiconductor layer, the third semiconductor layer including silicon and carbon, the third semiconductor layer being of the first conductivity type;

a fourth semiconductor layer located in a portion of the first semiconductor layer between the second semiconductor layers, the fourth semiconductor layer including silicon and carbon, the fourth semiconductor layer being of the second conductivity type;

a second electrode facing the second semiconductor layer via an insulating film; and a third electrode connected to the second and third semiconductor layers.

Note 2

The device according to note 1, further comprising:

a conductive layer having an ohmic connection with the second semiconductor layer, the third semiconductor layer, and the third electrode; and a metal layer located on the first semiconductor layer, the metal layer having a Schottky junction with the first semiconductor layer, the second semiconductor layer extending in a first direction, a plurality of first openings being arranged along the first direction in the second semiconductor layer, the third semiconductor layer extending in the first direction, a second opening and a third opening being alternately arranged along the first direction in the third semiconductor layer, the conductive layer being located in the second opening, the metal layer being located in the third opening and contacting a portion of the first semiconductor layer located in the first opening.

Note 3

The device according to note 2, wherein the metal layer and the conductive layer are alternately arranged along a second direction crossing the first direction.

Note 4

The device according to note 2 or 3, wherein the first semiconductor layer is interposed between the conductive layer and the fourth semiconductor layer.

Note 5

The device according to note 2 or 3, wherein the first semiconductor layer is interposed between the metal layer and the fourth semiconductor layer.

Note 6

The device according to any one of notes 1-5, wherein the fourth semiconductor layer is separated from an upper surface of the first semiconductor layer.

Note 7

The device according to any one of notes 1-6, wherein the fourth semiconductor layer contacts the second semiconductor layer.

Note 8

The device according to any one of notes 1-7, wherein an upper surface of the fourth semiconductor layer is positioned lower than an upper surface of the second semiconductor layer, and a lower surface of the fourth semiconductor layer is positioned higher than a lower surface of the second semiconductor layer.

Note 9

The device according to any one of notes 1-8, wherein the metal layer includes titanium.

Note 10

The device according to any one of notes 1-9, wherein the conductive layer includes nickel and silicon.

Note 11

A semiconductor device, comprising:

a first electrode;

a first semiconductor layer connected to the first electrode, the first semiconductor layer being of a first conductivity type;
a second semiconductor layer located on a portion of the first semiconductor layer, the second semiconductor layer being of a second conductivity type;
a third semiconductor layer located on a portion of the second semiconductor layer, the third semiconductor layer being of the first conductivity type;
a fourth semiconductor layer located on a side surface of the second semiconductor layer in the first semiconductor layer,
the fourth semiconductor layer being of the second conductivity type;
a second electrode located in a region including a region directly above the fourth semiconductor layer, the second electrode facing the second semiconductor layer; and
a third electrode connected to the second and third semiconductor layers.

Note 12

The device according to note 11, wherein
the first semiconductor layer, the second semiconductor layer, the third semiconductor layer, and the fourth semiconductor layer include silicon and carbon.

What is claimed is:

1. A semiconductor device, comprising:
a first electrode;
a first semiconductor layer connected to the first electrode, the first semiconductor layer including silicon and carbon, the first semiconductor layer being of a first conductivity type;
a plurality of second semiconductor layers located on a portion of the first semiconductor layer, the plurality of second semiconductor layers including silicon and carbon, the plurality of second semiconductor layers being of a second conductivity type;
a third semiconductor layer located on a portion of the second semiconductor layer, the third semiconductor layer including silicon and carbon, the third semiconductor layer being of the first conductivity type;
a fourth semiconductor layer located in a portion of the first semiconductor layer between the second semiconductor layers, the fourth semiconductor layer including silicon and carbon, the fourth semiconductor layer being of the second conductivity type;
a second electrode facing the second semiconductor layer via an insulating film;
a third electrode connected to the second and third semiconductor layers;
a conductive layer having an ohmic connection with the second semiconductor layer, the third semiconductor layer, and the third electrode; and
a metal layer located on the first semiconductor layer, the metal layer having a Schottky junction with the first semiconductor layer, wherein
the second semiconductor layer extends in a first direction,
a plurality of first openings is arranged along the first direction in the second semiconductor layer,
the third semiconductor layer extends in the first direction,
a second opening and a third opening are alternately arranged along the first direction in the third semiconductor layer,
the conductive layer is located in the second opening, and
the metal layer is located in the third opening and contacts a portion of the first semiconductor layer located in the first opening.

2. The device according to claim 1, wherein
the metal layer and the conductive layer are alternately arranged along a second direction crossing the first direction.

3. The device according to claim 1, wherein
the first semiconductor layer is interposed between the conductive layer and the fourth semiconductor layer.

4. The device according to claim 1, wherein
the first semiconductor layer is interposed between the metal layer and the fourth semiconductor layer.

5. The device according to claim 1, wherein
the fourth semiconductor layer is separated from an upper surface of the first semiconductor layer.

6. The device according to claim 1, wherein
the fourth semiconductor layer contacts the second semiconductor layer.

7. A semiconductor device, comprising:
a first electrode;
a first semiconductor layer connected to the first electrode, the first semiconductor layer including silicon and carbon, the first semiconductor layer being of a first conductivity type;
a plurality of second semiconductor layers located on a portion of the first semiconductor layer, the plurality of second semiconductor layers including silicon and carbon, the plurality of second semiconductor layers being of a second conductivity type;
a third semiconductor layer located on a portion of the second semiconductor layer, the third semiconductor layer including silicon and carbon, the third semiconductor layer being of the first conductivity type;
a fourth semiconductor layer located in a portion of the first semiconductor layer between the second semiconductor layers, the fourth semiconductor layer including silicon and carbon, the fourth semiconductor layer being of the second conductivity type;
a second electrode facing the second semiconductor layer via an insulating film; and
a third electrode connected to the second and third semiconductor layers, wherein
an upper surface of the fourth semiconductor layer is positioned lower than an upper surface of the second semiconductor layer, and
a lower surface of the fourth semiconductor layer is positioned higher than a lower surface of the second semiconductor layer.

8. The device according to claim 1, wherein
the metal layer includes titanium.

9. The device according to claim 1, wherein
the conductive layer includes nickel and silicon.

10. A semiconductor device, comprising:
a first electrode;
a first semiconductor layer connected to the first electrode, the first semiconductor layer being of a first conductivity type;
a second semiconductor layer located on a portion of the first semiconductor layer, the second semiconductor layer being of a second conductivity type;
a third semiconductor layer located on a portion of the second semiconductor layer, the third semiconductor layer being of the first conductivity type;
a fourth semiconductor layer located on a side surface of the second semiconductor layer in the first semiconductor layer, the fourth semiconductor layer being of the second conductivity type;

a second electrode located in a region including a region directly above the fourth semiconductor layer, the second electrode facing the second semiconductor layer; and a third electrode connected to the second and third semiconductor layers, wherein an upper surface of the fourth semiconductor layer is positioned lower than an upper surface of the second semiconductor layer, and a lower surface of the fourth semiconductor layer is positioned higher than a lower surface of the second semiconductor layer.

11. The device according to claim 10, wherein the first semiconductor layer, the second semiconductor layer, the third semiconductor layer, and the fourth semiconductor layer include silicon and carbon.

* * * * *